(12) United States Patent
Heidenblut et al.

(10) Patent No.: US 8,183,156 B2
(45) Date of Patent: May 22, 2012

(54) METHOD OF ETCHING A MATERIAL SURFACE

(75) Inventors: Maria Heidenblut, Schwarzenfeld (DE); Raimund Foerg, Straubing (DE); Walter Preis, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 1020 days.

(21) Appl. No.: 12/134,600

(22) Filed: Jun. 6, 2008

(65) Prior Publication Data

US 2009/0305510 A1    Dec. 10, 2009

(51) Int. Cl.
*H01L 21/302* (2006.01)
(52) U.S. Cl. ........ 438/689; 438/704; 438/706; 438/745; 438/906; 216/102
(58) Field of Classification Search .................... 216/102
See application file for complete search history.

(56) References Cited

U.S. PATENT DOCUMENTS

| | | | |
|---|---|---|---|
| 6,610,599 B1 * | 8/2003 | Chua et al. | 438/677 |
| 2006/0128159 A1 * | 6/2006 | Hillyer et al. | 438/706 |
| 2006/0138399 A1 * | 6/2006 | Itano et al. | 257/40 |

OTHER PUBLICATIONS

H. Xiao, Introduction to Semiconductor Manufacturing Technology, published by Prentice Hall, 2001, ISBN 0-13-022404-9, pp. 328-341.*

* cited by examiner

*Primary Examiner* — Lan Vinh
*Assistant Examiner* — Jiong-Ping Lu
(74) *Attorney, Agent, or Firm* — Slater & Matsil, L.L.P.

(57) ABSTRACT

Disclosed is a method of structuring a material surface by dry etching, so that a passivation layer soluble in a solvent forms by the dry etching on parts of the structured material surface, sealing the passivation layer with a substance soluble in the solvent, and removing the sealed passivation layer and the substance by means of the solvent.

18 Claims, 3 Drawing Sheets

METHOD OF ETCHING A MATERIAL SURFACE

BACKGROUND

Dry etching processes, such as plasma etching processes, are employed in the fabrication of integrated circuits, primarily for producing fine structures. An etching mask, generally in the form of a photoresist pattern, will be transferred as dimensionally stable as possible into an underlying layer to be patterned. A layer following the layer to be etched or to be structured normally is not to be etched. For satisfying these requirements, an etching process to be used, for example, a chemical-physical dry etching process, has to have a high degree of anisotropy and great selectivity with respect to the underlying layer and the etching mask. The layers or material surfaces to be etched may, for example, comprise silicon (monocrystalline, polycrystalline or amorphous), $SiO_2$, $Si_3N_4$, metals (e.g., aluminum), metal silicide or organic polymer layers.

In chemical-physical dry etching methods, material layers are structured such that superfluous material areas are etched away by means of etching masks. In these processes, by etching, a passivation layer (polymer layer), which has a protective function during the etching process and guarantees for anisotropy of the etching procedure, but which is undesired after the completed etching process and has to be removed completely, possibly using expensive solvents with wet-chemical methods, for example, may form on parts of the structured material layers. At the same time, this procedure also creates an increased environmental burden.

SUMMARY OF THE INVENTION

Embodiments of the present invention include a method of structuring a material surface by dry etching, so that a passivation layer soluble in a solvent forms on parts of the structured material surface by the dry etching, sealing the passivation layer with a substance soluble in the solvent, and removing the sealed passivation layer and the substance by means of the solvent.

BRIEF DESCRIPTION OF THE DRAWINGS

Embodiments of the present invention will be explained in greater detail in the following with respect to the accompanying drawings, in which.

DETAILED DESCRIPTION OF ILLUSTRATIVE EMBODIMENTS

Chemical-physical dry etching is of great importance in the production of highly integrated circuits, because very fine structures can be produced therewith. Through bombardment with ions, electrons or photons, a chemical etching reaction is triggered on a material surface to be etched. If the particle bombardment takes place in a perpendicular manner, a masked structure may be transferred in a dimensionally stable manner into an underlying layer, i.e., a layer to be etched. A prerequisite for an etching procedure is the formation of a volatile reaction product. In reactors for chemical-physical dry etching presently employed in the semiconductor technology, the chemical etching reaction is triggered by ion bombardment. Here, reactors based on a parallel plate reactor are mainly widespread. It satisfies the prerequisites for an anisotropic etching process, the perpendicular bombardment of the material surface to be etched with ions. Such a reactor substantially includes a vacuum chamber with an inlet for etching gas, an attachment for a vacuum pump, and two parallel electrodes. In reactive ion etching (RIE—reactive plasma ion etching), a high-frequency voltage is capacitively coupled to a bottom electrode. A top electrode is connected to the vacuum chamber and grounded. Together with the chamber, the top electrode forms a greater surface area than the bottom electrode. This results in the fact that the bottom electrode is charged more negatively than the top one. The ions from the plasma hence obtain sufficiently high kinetic energy (>100 electron volts) on the way to the material surface to be etched, for triggering a chemical etching reaction. Moreover, the gas pressure in the etching chamber is relatively low (0, 1 . . . 10 Pascal), so that there are hardly any impacts on the ions. Hence, they perpendicularly reach the surface to be etched and transfer the mask in a dimensionally stable manner into the underlying material surface to be structured.

Figure 4:
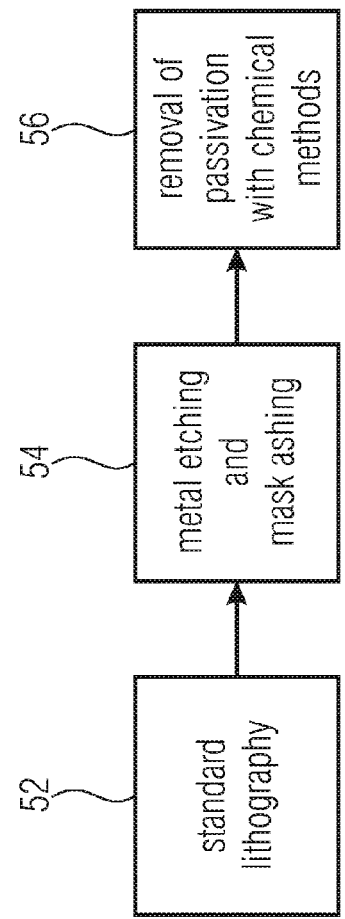
FIG. 4 shows a conventional dry etching method.

An overview of such a processing is given in FIG. 4.

In a first step 52, a surface to be structured or to be etched, such as a metal surface, is provided with a mask. This mask may, for example, be a photoresist applied to the surface to be structured with conventional lithography processes. Thereafter, in a further step 54, superfluous material areas are etched away. Metal, particularly aluminum, cannot be etched with fluorine-containing gases, as the reaction product $AlF_3$ becomes volatile at temperatures only above 800° C. For etching aluminum, rather chlorine, iodine or bromine-containing etching gases are suited for this reason. Their reaction products, however, are also volatile only at temperatures above 50° C. Frequently used etching gases are $Cl_2/He$, $SiCl_4$, HBr, $BCl_3$, $BCl_3/Cl_2$, HCl and HJ. When using halogen-containing etching gases, such as chlorine, for example, a passivation layer of an aluminum halide (e.g., aluminum chloride, $AlCl_3$), which has a protective function during the etching process and guarantees anisotropy of the etching procedure, forms by etching on parts of the aluminum layers to be structured. In general, the composition of the developing passivation layer is dependent on the material to be etched and the etching gas used. In case of aluminum as a material to be etched and chlorine-containing etching gases, the passivation layer will comprise aluminum chloride. In the case of aluminum as a material to be etched and iodine-containing etching gases, the passivation layer will comprise aluminum iodine. In the case of aluminum as a material to be etched and bromine-containing etching gases, the passivation layer will include aluminum bromide ($AlBr_3$). Other materials to be etched, such as semiconductor substrates, other etching gases and passivation layers resulting therefrom are, therefore, also possible.

Furthermore, in a step 54, after performing one or more etching steps, the photoresist or mask is once again removed. This procedure is called ashing or stripping. This may, for example, be done in a wet-chemical manner. In the semiconductor industry, this step typically takes place in a plasma incinerator. A microwave-excited oxygen plasma may be used to isotropically etch the photoresist away from the structured material surface. In this step, the passivation layers frequently oxidize into components which are hardly soluble in liquids.

Finally, in a step 56, the passivation (e.g., $AlCl_3$) and/or the oxidation product resulting therefrom, undesired after the etching process, is removed completely in an environmentally polluting manner with wet-chemical processes often using expensive solvents.

Such etching processes or methods described on the basis of FIG. 4 are not environmentally friendly due to the employment of wet-chemical solvents. Furthermore, they have a relatively high process time and are often quite cost-consuming due to the type of solvents used.

In order to avoid the above problems, an alteration of the process previously described on the basis of FIG. 4 in dry or plasma etching for structuring material surfaces is proposed, which will be described in detail in the following on the basis of FIGS. 1 to 3.

Figure 1A:
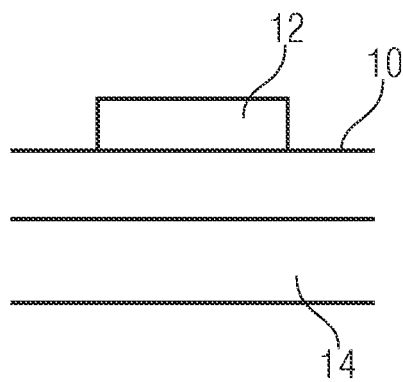
FIGS. 1a to 1d show schematic cross-sectional views for illustrating an embodiment of an inventive method.
Figure 1B:
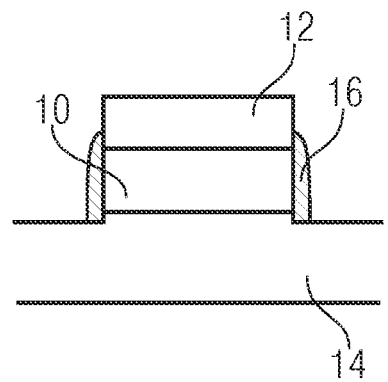

FIG. 1a shows a material 10 prior to a step of dry etching, such as plasma etching. An etch mask 12, such as photoresist, is arranged on top of the material 10. FIG. 1b shows the structure after having dry etched the material 10 making use of the etch mask 12. During etching, substrate 14 may act as an etch stop, wherein etching may proceed slightly into the substrate as indicated in FIG. 1b.

As shown in FIG. 1b, the dry etching forms a passivation layer (polymer layer) 16 on the side walls of the structured material 10 and, in part, on the side walls of the etching mask. The passivation layer is typically a polymer layer formed of a reaction product of the material 10 and an etching gas used.

Here, the material 10 may comprise common materials to be etched with dry etching methods in the semiconductor technology, such as silicon-containing materials or metals (e.g., aluminum, copper, etc.). The material 10 may also comprise aluminum metallizations, such as AlCu or AlSiCu, or $SiO_2$/Si layers (via processes). Other conceivable materials 10 may comprise Ti, TiN, W, Ta, TaN, Mo, TiO, $Si_3N_4$, and $Al_2O_3$. An appropriate etching gas which is adapted for etching the respective material 10 may be used as it is clear for a person skilled in the art.

For the case where the material 10 comprises aluminum and a chlorine-containing etching gas is used, the passivation layer 16 may comprise $AlCl_3$. In general, in case the material 10 to be etched comprises metal and compounds of halogens (F, Cl, Br or J) are used in etching gases, the passivation layer 16 may comprise metal halides. Moreover, the passivation layer 16 may also comprise small proportions of resist molecules of the photoresist 12 (e.g., Al—O—Si—Cl compounds). For example, if the material 10 is silicon-containing, compounds of the halogens F, Cl, Br and J may, for example, be used as etching gases. Hence, the passivation layer 16 in this case could, for example, also comprise silicon tetrahalides (e.g., silicon tetra-chloride, $SiCl_4$). The passivation layer 16 has a protective function during the plasma etching process and promotes the anisotropy of the etching procedure. The passivation layer 16, for example, prevents underetching of the mask 12. Depending on the material 10 to be etched and/or the etching or reactive gas, the passivation layer 16 is soluble in a liquid. For example, $AlCl_3$ is soluble, e.g., water-soluble, in many organic solvents directly after finishing the plasma etching process.

The resist ashing, i.e., the removal of the mask 12, may be achieved with oxygen-containing plasmas. Moreover, the etching of the material 10 and the removal of the resist 12 generally does not take place in one and the same reactor, so that the materials 10 to be etched and the passivation layer 16 are often exposed to the air in the transition from one reactor to the other. This and/or the resist ashing leads to oxidation of the passivation layers 16 into water-insoluble final components. For example, $AlCl_3$ becomes aluminum oxide ($Al_2O_3$).

So as to prevent such oxidation of the passivation layer 16, embodiments of the present invention provide for sealing the passivation layer 16 directly after the plasma etching process with a substance soluble in the same solvent as the passivation layer 16. This step of sealing the passivation layer 16 is shown in FIG. 1c.

Figure 1C:
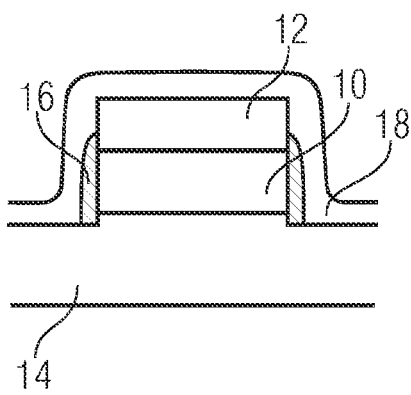

As shown in FIG. 1c, a substance 18 is applied completely covering the passivation layer 16. The substance 18 which seals the passivation layer 16 is soluble in the same solvent as the passivation layer 16. For example, if the passivation layer 16 thus is water-soluble, the sealing layer 18 also is water-soluble. The sealing layer 18 serves to prevent oxidation of the passivation layer 16. At this point, the sealing layer 18, must not oxidize into a substance insoluble in a solvent itself (e.g., by exposing the sealing layer 18 to air), so that the sealed passivation layer 16, together with its sealing layer 18, may be removed by means of the solvent, for example, de-ionized water (DI water), in a subsequent process step. Thus, after sealing the passivation layer 16, there follows a rinsing step in which both the sealing layer 18 and the passivation layer 16 may be removed from the structured material surface with the solvent, e.g., de-ionized water.

The sealing layer 18 may comprise, e.g., sugar-like substances including, e.g., monosaccharides, disaccharides, trisaccharides and the oligosaccharides. Further, the sealing layer 18 may comprise, e.g., gel-like substances. The sealing layer 18 may be supplied, e.g., by spin-coating processes or immersion processes.

Figure 1D:
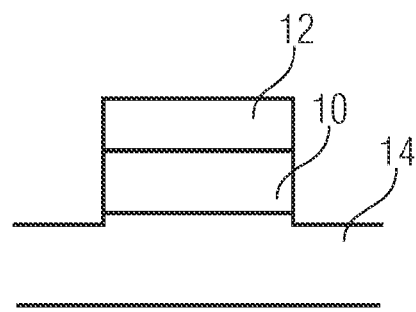

The etched material 10, freed from the passivation layer 16 and the sealing layer 18, together with the mask 12 still remaining, is schematically shown in FIG. 1d.

Finally, after removing the sealed passivation layer 16, the mask 12 is also removed. This may again be done with conventional methods, such as resist ashing.

Embodiments of the present invention may thus optimize existing methods including dry or plasma etching for avoiding residues of the passivation layer 16 after the etching processes and a subsequent wet chemical cleaning process for removing oxidized passivation layers. For example, conventional processes comprise the following:

metal deposition
photo technique
plasma etching
resist removing
removing the passivation layer with environmentally polluting solvents.

Embodiments of the present invention alter this processing method such that the passivation layer 16 is removed before the resist removal takes place. Thus, with regard to the embodiments of the present invention, the following optimized processing results are:

metal deposition
photo technique
plasma etching
applying the sealing layer
removing the sealing layer and the passivation layer 16 with environmentally friendly solvents, e.g., de-ionized water
resist removing Through the altered processing, semiconductor devices may be produced with a more environmentally friendly fabrication method than previously obtained, given that no environmentally harmful chemicals or environmentally harmful solvents are needed to remove the passivation layers 16. Moreover, the resulting processing costs may be reduced by a lower cost of material and a reduction in the processing time.

In summary, on the basis of FIGS. 2 and 3, a method according to embodiments of the present invention will be described.

Figure 2:
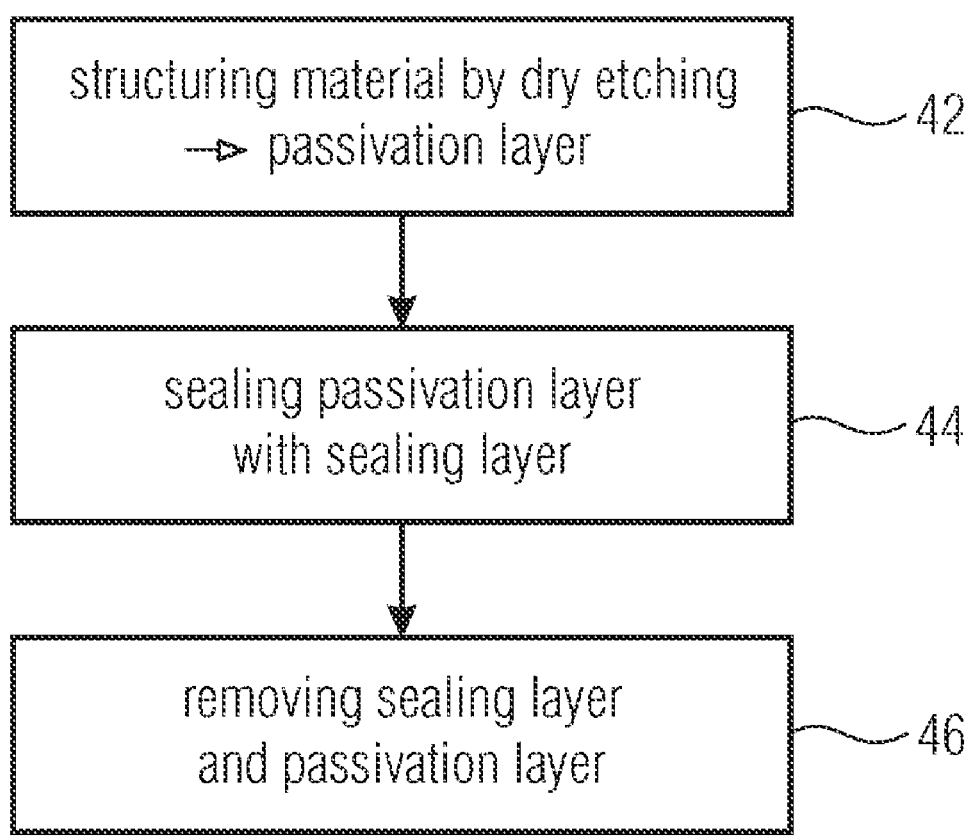
FIG. 2 shows a flow chart of a dry etching method according to an embodiment.

According to FIG. 2, in a first step 42, a material surface 10 is structured by dry etching, such as plasma etching, so that a liquid-soluble passivation layer 16 is formed on parts of the structured material surface. In a second step 44, the passivation layer 16 is sealed with a substance 18 soluble in the (environmentally friendly) liquid or solvent. In a further step 46, the sealed passivation layer 16, i.e., the passivation layer 16 and the sealing layer 18, is removed by means of the liquid. Thereafter, conventional process steps may be applied so as to remove residues of photoresists, for example.

Figure 3:
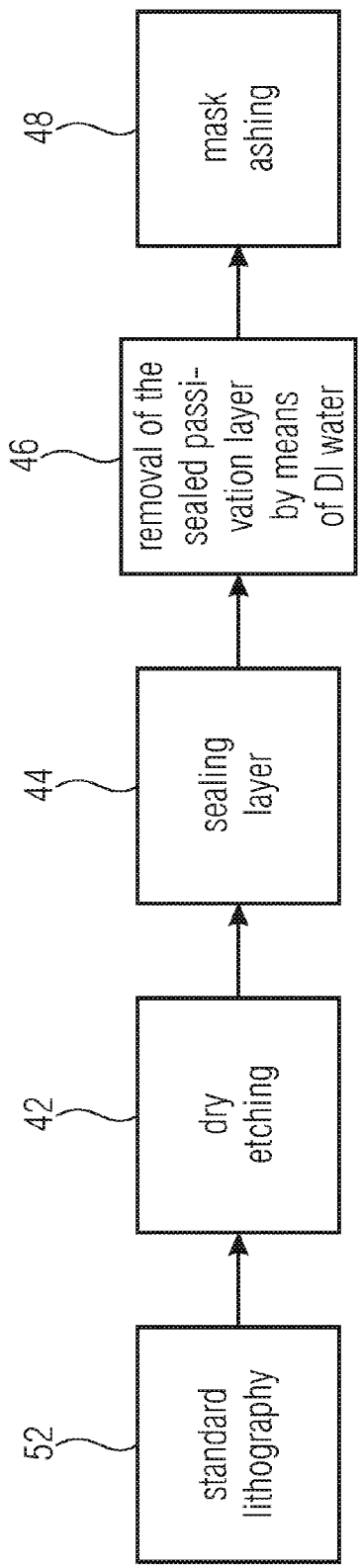
FIG. 3 shows a flow chart of a dry etching method according to a further embodiment.

According to FIG. 3, a standard lithography 52 may be used to structure an etching mask and dry etching 42, such as metal etching, may be performed using the etching mask. In embodiments, an aluminum surface may be structured by reactive plasma ion etching. In such case, a passivation layer 16 comprising $AlCl_3$ will be formed by the reactive plasma ion etching with a chlorine-containing reactive or etching gas. A sealing layer is applied 44 to the etched structure and, in particular to the passivation layer 16. In embodiments, a water-soluble substance 18 is applied to the passivation layer 16, in order to weaken or completely prevent oxidation of the passivation layer 16. Thereupon, the sealing layer and the passivation layer are removed 46, such as by means of de-ionized water in the case of water-soluble passivation and sealing layers 16 and 18. Finally, the etching mask is removed 48.

According to other embodiments, the material surface may also be a combination of substances or represent a different substance, such as silicon-containing substances or other common materials used in semiconductor production processes. The reactive gas used for the plasma etching process is subsequently tuned to the respective material 10. With fluorine-containing etching gases, fluoride-containing passivation layers may thus, for example, develop, with chlorine-containing etching gases, the passivation layers 16 have a chloride proportion. The passivation and sealing layers 16, 18 may also be soluble in liquids other than water.

Accordingly, the methods or procedures described herewith are only exemplary and not intended to be limiting. Other embodiments of the present invention may deviate from the methods described.

What is claimed is:

1. A method, comprising:
   structuring a material surface by dry etching using an etching mask, so that a passivation layer soluble in a solvent forms by the dry etching on parts of the structured material surface;
   applying a sealing layer covering the passivation layer and the etching mask for sealing the passivation layer with a substance soluble in the solvent; and
   removing the sealed passivation layer and the substance from the material surface using the solvent.

2. The method according to claim 1, wherein structuring the material surface comprises reactive ion etching.

3. The method according to claim 1, wherein, in structuring, a water-soluble passivation layer forms on parts of the structured material surface.

4. The method according to claim 3, wherein, applying the sealing layer comprises applying a water-soluble substance onto the passivation layer in order to at least weaken oxidation of the passivation layer.

5. The method according to claim 4, wherein the sealing layer comprises a sugar or a gel.

6. The method according to claim 5, wherein removing the sealed passivation layer is performed using de-ionized water.

7. The method according to claim 1, wherein structuring the material surface comprises structuring an aluminum-containing surface by reactive ion etching with a halogen-containing etching gas.

8. The method according to claim 7, wherein a passivation layer comprising an aluminum halide forms by means of the reactive ion etching on parts of the structured aluminum-containing surface.

9. The method according to claim 1, wherein structuring the material surface comprises structuring a semiconductor substrate surface by reactive ion etching with a halogen-containing etching gas.

10. The method according to claim 1, wherein sealing the passivation layer and removing the sealed passivation layer take place prior to removing the etching mask from the material surface.

11. The method according to claim 1, wherein the sealed passivation layer and the substance are removed using an organic solvent.

12. A method, comprising:
   structuring a metal surface by a reactive ion etching process using an etching mask, wherein a water-soluble passivation layer forms by etching on parts of the structured metal surface;
   applying a sealing layer covering the passivation layer and the etching mask for sealing the water-soluble passivation layer with a water-soluble substance; and
   removing the sealed passivation layer and the substance with de-ionized water.

13. The method according to claim 12, wherein structuring the metal surface comprises structuring an aluminum-containing surface by reactive ion etching with a halogen-containing etching gas.

14. The method according to claim 13, wherein a passivation layer comprising an aluminum halide forms by the reactive ion etching on parts of the structured aluminum-containing surface.

15. The method according to claim 12, wherein structuring the metal surface comprises structuring an aluminum-containing surface by reactive ion etching with a chlorine-containing etching gas.

16. The method according to claim 15, wherein a passivation layer comprising aluminum chloride forms by the reactive ion etching on parts of the structured aluminum-containing surface.

17. The method according to claim 12, wherein the sealing layer comprises a sugar or a gel.

18. The method according to claim 17, wherein applying the sealing layer comprises forming a spin-coating or an immersion process.

* * * * *